(12) United States Patent
Liukku

(10) Patent No.: US 11,296,671 B2
(45) Date of Patent: Apr. 5, 2022

(54) MEMS FREQUENCY-TUNING SPRINGS

(71) Applicant: MURATA MANUFACTURING CO., LTD., Nagaokakyo (JP)

(72) Inventor: Matti Liukku, Helsinki (FI)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 285 days.

(21) Appl. No.: 16/577,086

(22) Filed: Sep. 20, 2019

(65) Prior Publication Data

US 2020/0099357 A1    Mar. 26, 2020

(30) Foreign Application Priority Data

Sep. 26, 2018 (FI) ...................................... 20185801

(51) Int. Cl.
*H03H 9/02* (2006.01)
*H03H 3/007* (2006.01)
(Continued)

(52) U.S. Cl.
CPC ....... *H03H 9/02409* (2013.01); *B81B 3/0045* (2013.01); *H03H 3/0077* (2013.01);
(Continued)

(58) Field of Classification Search
CPC ............. H03H 3/0077; H03H 9/02259; H03H 9/02338; H03H 9/02362; H03H 9/02393;
(Continued)

(56) References Cited

U.S. PATENT DOCUMENTS 5,914,553 A * 6/1999 Adams ................ G01P 15/0891
310/309
7,932,788 B2 * 4/2011 Schenk ................. B81B 3/0078
331/96
(Continued)

FOREIGN PATENT DOCUMENTS

DE 102016014001 A1 5/2018
JP 09-178493 A * 7/1997 ......... G01C 19/5755
(Continued)

OTHER PUBLICATIONS

Mar. 10, 2020 Search Report issued in European Application No. 1995339.
(Continued)

*Primary Examiner* — Barbara Summons
(74) *Attorney, Agent, or Firm* — Squire Patton Boggs (US) LLP

(57) ABSTRACT

A microelectromechanical system with at least one partly mobile mass element which is suspended from a fixed support by one or more suspension units. Each suspension unit comprises first springs which extend from the fixed support to the partly mobile mass element, and second springs which also extend from the fixed support to the partly mobile mass element. Each second spring is substantially parallel and adjacent to one first spring. The first springs are electrically isolated from the second springs, and the microelectromechanical system comprises a voltage source configured to apply a frequency tuning voltage between the one or more first springs and the one or more second springs.

8 Claims, 5 Drawing Sheets

(51) Int. Cl.
  *B81B 3/00* (2006.01)
  *H03H 9/24* (2006.01)
(52) U.S. Cl.
  CPC . *H03H 9/2405* (2013.01); *H03H 2009/02165* (2013.01); *H03H 2009/02496* (2013.01); *H03H 2009/02519* (2013.01)
(58) Field of Classification Search
  CPC .... H03H 9/02409; H03H 9/15; H03H 9/2405; H03H 2007/008; H03H 2009/02165; H03H 2009/02496; H03H 2009/02519; H03H 2009/155; B81B 3/0035; B81B 3/0045; B81B 7/008; B81B 2201/0271; H03B 5/30; G01C 19/5656
  USPC .................................................. 333/188, 186
  See application file for complete search history.

(56) References Cited

U.S. PATENT DOCUMENTS

| | | |
|---|---|---|
| 7,999,635 B1 | 8/2011 | Quevy et al. |
| 2004/0056742 A1 | 3/2004 | Dabbaj |
| 2008/0165403 A1* | 7/2008 | Grasshoff ............. B81B 3/0086 359/199.1 |
| 2011/0234206 A1 | 9/2011 | Kawakubo et al. |
| 2013/0154440 A1* | 6/2013 | Hentz ................... H01L 41/053 310/318 |
| 2013/0301101 A1 | 11/2013 | Conrad et al. |
| 2016/0308507 A1* | 10/2016 | Engelen ............. H03H 9/02393 |
| 2017/0153445 A1 | 6/2017 | Gerson et al. |

FOREIGN PATENT DOCUMENTS

| | | |
|---|---|---|
| JP | 2011-203228 A | 10/2011 |
| JP | 2014-027693 A | 2/2014 |
| JP | 2015099270 A | 5/2015 |

OTHER PUBLICATIONS

Finnish Search Report dated Mar. 20, 2019 corresponding to Finnish Application No. 20185801.

Office Action dated Nov. 26, 2021 corresponding to European Patent Application No. 19195339.7.

* cited by examiner

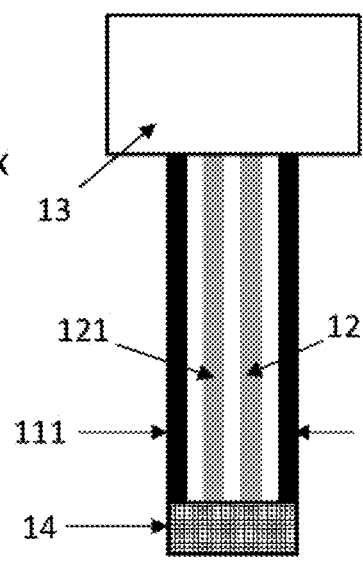
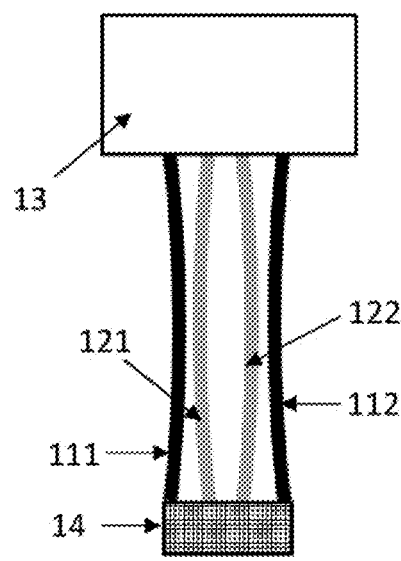
$V_{12} = 0$  $V_{12} > 0$
Figure 1a  Figure 1b
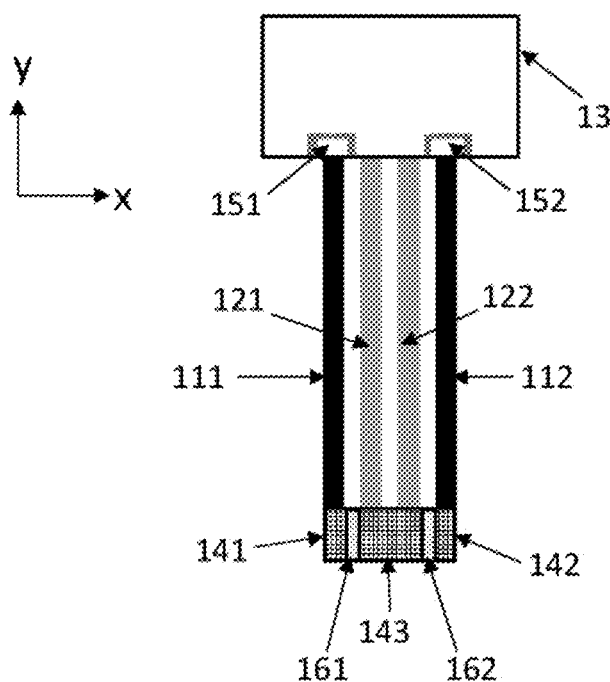
Figure 1c

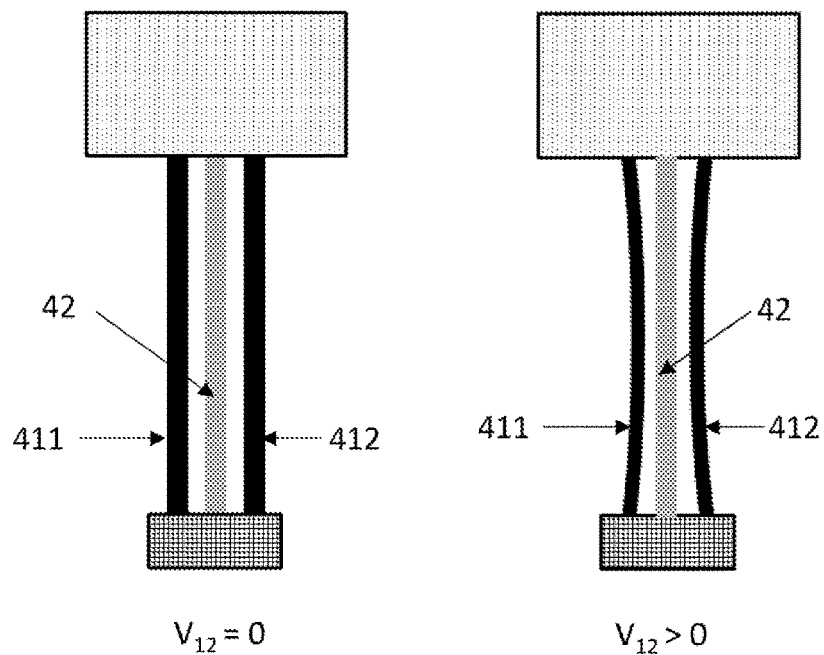
$V_{12} = 0$
Figure 4a
$V_{12} > 0$
Figure 4b
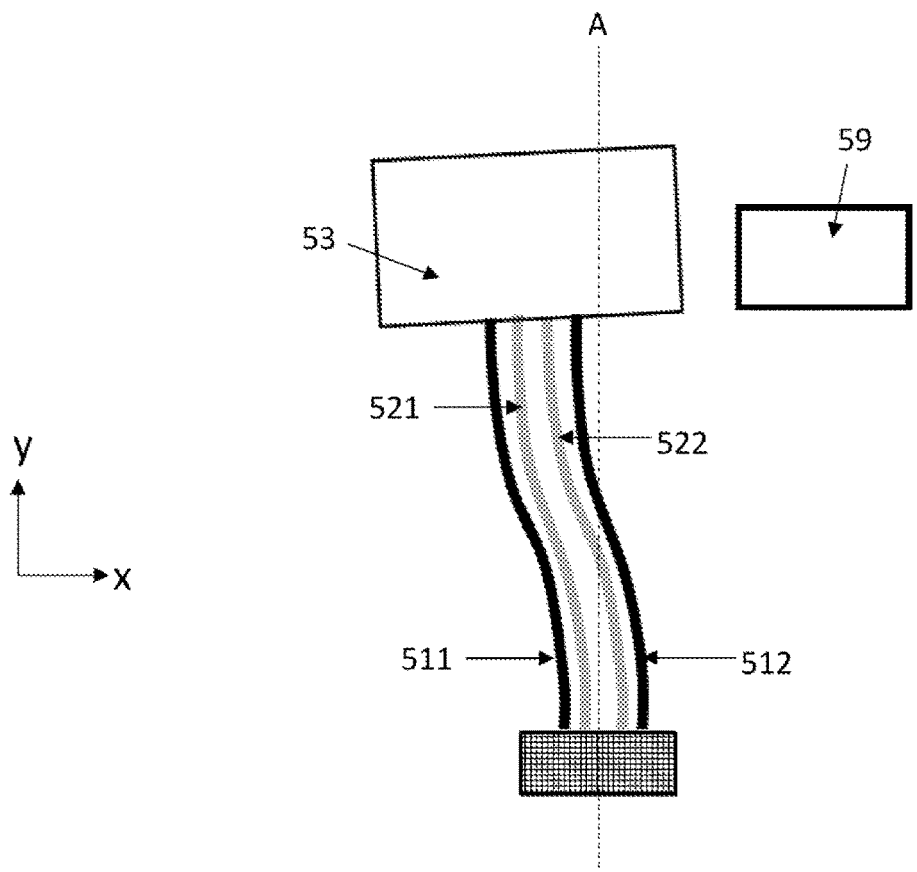
Figure 5

MEMS FREQUENCY-TUNING SPRINGS

FIELD OF THE DISCLOSURE

The present disclosure relates to microelectromechanical (MEMS) systems, such as acceleration sensors, gyroscopes, resonators and scanning micromirrors and more particularly to frequency control in resonating elements.

BACKGROUND OF THE DISCLOSURE

MEMS components which comprise mass elements in resonance oscillation should typically maintain a constant resonant frequency. It is usually preferable that all components with the same device structure should operate at the same resonance frequency, and this frequency should remain constant over the useful lifetime of the components. Achieving this goal can be challenging because the mechanical properties of oscillating elements may differ from ideal design values due to nonzero manufacturing process tolerances and they may also change when the MEMS component is exposed to external stress factors such as temperature variation.

To solve these problems and maintain a constant resonance frequency (or to accurately adjust any resonance frequency within a certain range), a frequency tuning unit may be incorporated in each component. Frequency tuning units are typically controlled by an electric signal which applies a frequency tuning voltage to tuning electrodes which lie adjacent to the resonating mass element. By adjusting the frequency tuning voltage, the resonant frequency of the mass element can be maintained at a desired value (or adjusted within a certain range) even if the manufacturing process was not ideal or the component undergoes ageing.

The frequency tuning unit may include one tuning electrode on the resonating mass element and another tuning electrode on an adjacent fixed structure. One way to implement such tuning electrodes is to arrange them so that they form a parallel-plate capacitor. A voltage bias between parallel-plate tuning electrodes produces an electrostatic force which increases as the gap between the tuning electrodes decreases. This reduces the effective spring constant associated with the oscillation mode and thereby reduces the resonant frequency. Document U.S. Pat. No. 7,999,635 discloses a MEMS element with parallel-plate frequency-tuning electrodes.

However, the practical tuning range is quite limited in parallel-plate configurations because the gap between frequency tuning electrodes must be narrow if any tuning is to be achieved. Parallel-plate frequency tuning is difficult to implement in a useful manner in applications where the oscillation amplitude is large.

Tuning electrodes on an oscillating element and a fixed structure may also be configured as vertical parallel comb fingers. They allow the oscillation frequency to be increased. Document U.S. Pat. No. 9,869,858 discloses a MEMS element with comb finger frequency-tuning electrodes. However, in applications where the oscillation amplitude is large, frequency tuning through comb fingers is typically active only in a small part of the oscillation cycle. The tuning electrodes arranged on the mobile element will be distant from the fixed tuning electrodes for most of the cycle. Frequency tuning is therefore difficult to implement effectively with comb fingers if the oscillation amplitude is large.

BRIEF DESCRIPTION OF THE DISCLOSURE

An object of the present disclosure is to provide an apparatus for overcoming the above problems. The object of the disclosure is achieved by an arrangement and a method which are characterized by what is stated in the independent claims. The preferred embodiments of the disclosure are disclosed in the dependent claims.

The disclosure is based on the idea of incorporating frequency tuning electrodes on suspension springs which suspend the partly mobile mass element from a fixed structure. An advantage of the claimed arrangement and method is that the suspension springs follow the movement of the oscillating mass element along its full oscillation amplitude, so that a frequency tuning force can be generated during the entire oscillation cycle.

BRIEF DESCRIPTION OF THE DRAWINGS

In the following the disclosure will be described in greater detail by means of preferred embodiments with reference to the accompanying drawings, in which FIGS. 1a-1b illustrate illustrates a mass element configured to undergo oscillation in the device plane and first and second springs.

FIG. 1c illustrates isolation of the first and second springs.

FIGS. 4a-4b illustrate a suspension unit which comprises two first springs and one second spring.

FIG. 5 illustrates in-plane oscillation.

DETAILED DESCRIPTION OF THE DISCLOSURE

Figure 2:
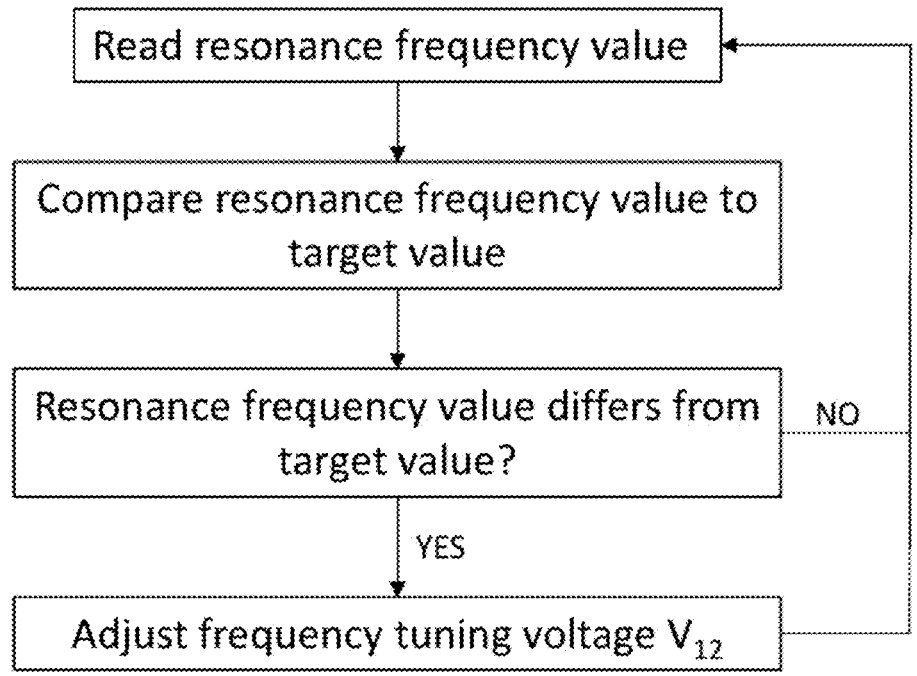
FIG. 2 illustrates a method for tuning a resonance frequency.

This disclosure describes a microelectromechanical system that comprises a fixed support, at least one partly mobile mass element which is suspended from the fixed support by one or more suspension units, and at least one drive transducer which is configured to set the partly mobile mass element in resonance oscillation at a resonance frequency. Each suspension unit comprises one or more first springs which extend from the fixed support to the partly mobile mass element. Each suspension unit also comprises one or more second springs, and each second spring extends from the fixed support to the partly mobile mass element substantially parallel and adjacent to one first spring. The one or more first springs are electrically isolated from the one or more second springs, and the microelectromechanical system further comprises a voltage source configured to apply a frequency tuning voltage between the one or more first springs and the one or more second springs.

A corresponding method for tuning a resonance frequency in the microelectromechanical system comprises the steps of repeatedly reading the resonance frequency from the microelectromechanical system and comparing it to a predetermined target value and, if the resonance frequency differs from the predetermined target value, adjusting the frequency tuning voltage to a value where the resonance frequency becomes equal to the predetermined target value. The microelectromechanical system may comprise a control unit which performs the steps described in this method.

FIG. 1a illustrates a microelectromechanical system with a partly mobile mass element 13 and an anchor point 14 which forms a part of a fixed support. In this disclosure, a "fixed" support means an object which is much larger than the MEMS gyroscope structure, for example the device wafer. Alternatively, a fixed support can mean an object which is securely attached to such a larger structure, so that it cannot be moved in relation to this structure. The term "anchor point" refers to a region of a fixed support where partly mobile objects such as suspenders are attached to the fixed support. Anchor points are ideally impervious to the reaction forces that are transmitted to the fixed support by the suspenders when the mass element oscillates. In other words, an anchor point should ideally remain stationary in the device wafer even when the mass element oscillates.

Flexible suspenders are typically fixed to an anchor point at one end, and the other end may be attached to the partly mobile mass element. The mass elements may be set in motion for example by capacitive or piezoelectric actuation. Capacitive actuators may, for example, comprise interdigitated comb fingers which function as electrodes. Rotor electrodes may be placed on a mobile structure such as the mass element or the suspenders, and stator electrodes may be placed on a stationary structure, such as a frame which surrounds the proof mass and forms a part of the fixed support. Piezoelectric actuators may for example be formed by depositing electrode layers and one or more piezoelectric layers on the suspenders.

The device wafer may be a silicon wafer, and the microelectromechanical structures may be formed in the device wafer for example by etching. The microelectromechanical system may comprise a frame which surrounds the mass element and the springs and defines a device plane, illustrated as the xy-plane in the figures of this disclosure. Alternatively, even if no frame is present, the mass element may exhibit a longitudinal length (for example along the x-axis in FIG. 1a) and a lateral width (for example along the y-axis). The length and the width may define a device plane which is illustrated as the xy-plane. The device plane is typically parallel to the main surfaces of the device wafer.

A partly mobile element, which is here called a "mass element", which may also be called a proof mass or inertial mass, is an object which is attached to a fixed support with flexible suspenders. By dimensioning elongated suspenders suitably, they can be configured to be flexible for certain types of bending or twisting movement, so that they allow the partly mobile mass element to oscillate in translational movement in the device plane, translational movement out of the device plane, and/or rotational movement out of the device plane. The at least one drive transducer may be configured to induce the same in-plane and/or out-of of plane oscillation modes. Flexible suspenders may be sufficiently flexible to be bent by the movement of the inertial mass to which they are attached, and/or by the actuators which set the mass in motion.

In this disclosure, the term "suspender" will be used as a general term for beams which attach a partly mobile mass element to a fixed support. Suspenders may also be called springs and their dimensions typically have a significant influence on the mechanical spring constant of the oscillator. A spring may be a homogeneous and unitary beam, where elastic properties remain the same along the entire beam. Such springs bend with a uniform curvature along their entire length when affected by forces acting on the two ends of the spring.

This disclosure focuses on suspenders which have been dimensioned for flexibility, but some applications may also comprise suspenders which are not flexible. In this disclosure, the term "suspension unit" refers to a group of adjacent springs, some of which can be set at different electric potentials. For reasons of simplicity, the mass element is suspended only from one suspension unit in the embodiments illustrated in this disclosure. However, it is possible to suspend the mass element both from a suspension unit and from additional suspenders which do not form a part of a suspension unit. These additional suspenders may, for example, be rigid in a certain direction so that they prevent undesired movement of the mass element in that direction. Alternatively, the mass element can also be suspended from multiple suspension units, for example so that one suspension unit is placed on one side of the mass, and another suspension unit on the other side of the mass. In either case, each suspension unit can be configured to operate in the manner described in the embodiments presented below.

FIG. 1a illustrates a mass element 13 which is configured to undergo translational oscillation in the device plane, which is called in-plane oscillation in this disclosure.

The microelectromechanical system illustrated in FIG. 1a comprises first springs 111 and 112 and second springs 121 and 122 which extend from the anchor point 14 to the mass element 13. As seen in the figure, each second spring extends to the mass element 13 substantially parallel and adjacent to one first spring. Together, first springs 111 and 112 and second springs 121 and 122 form a suspension unit.

The first springs 111-112 and second springs 121-122 may have similar dimensions, or substantially the same dimensions. The bending spring constants of the first springs 111-112 may be similar to the spring constants of the second springs 121-122, or substantially the same. Both the first and second springs will then respond in approximately the same manner to the oscillation of the mass element 13. They will then also remain approximately parallel throughout the oscillation cycle although, as explained below, the frequency-tuning voltage will typically bend them slightly towards each other at the middle.

As illustrated in the figures of this disclosure, the first and second springs may be separated from each other by a gap, so that no structure connects any first spring to any second spring between the fixed structure 14 and the mass element 13. In other words, the first end of each first and second spring may be fixed to the anchor point 14, the second end of each first and second spring may be fixed to the mass element 13, and springs may be constructed without any intervening body connecting any first spring to any second spring between the anchor point 14 and the mass element 13.

The mass element, anchor point and suspension unit may, for example, be manufactured in an etching process where a device wafer lying in the horizontal xy-plane illustrated in FIGS. 1a and 1b is etched at least in the vertical z-direction.

The first springs 111 and 112 are electrically interconnected so that they can both be set to a first electric potential. The second springs 121 and 122 are also electrically interconnected so that they can be set to a second electric potential. The potential difference between the first electric potential and the second electric potential will in this disclosure be called the frequency tuning voltage $V_{12}$.

FIG. 1a illustrates a situation where $V_{12}$ is zero and first springs 111 and 112 and second springs 121 and 122 are parallel. FIG. 1b illustrates a situation where a nonzero frequency tuning voltage $V_{12}$ is applied between the first springs and the second springs. Much like in a parallel-plate capacitor, an attractive electrostatic force is generated by the frequency tuning voltage between the first springs and the second springs. This force bends the first springs and second springs towards each other, as illustrated in FIG. 1b. Even while bending, the first and second springs remain substantially parallel.

The resonance frequency f of a harmonic oscillator is proportional to the electric spring constant. The relation can be written as $$f=1/(2\pi)\sqrt{(k_m+k_e)/m} \qquad (1)$$

where $k_m$ is a mechanical spring constant, $k_e$ an electric spring constant and m is the mass. The resonance frequency of the harmonic oscillator can be changed by changing either the mechanical spring constant $k_m$ or the electric spring constant $k_e$.

The potential energy E in a MEMS capacitor can be written as $$E=\tfrac{1}{2}k_m x^2 - \tfrac{1}{2}CV^2, \qquad (2)$$

wherein $k_m$ is the mechanical spring constant, x is a displacement from the initial capacitor position, C is capacitance and V is the voltage applied over the capacitor.

If the voltage over the capacitor is kept constant, the electric force $F_e$ acting on the capacitor is obtained by $$F_e = -\partial E/\partial x = \tfrac{1}{2}V^2 \partial C/\partial x. \qquad (3)$$

An electric spring constant $k_e$ can then be obtained from $$k_e = -\partial F_e/\partial x = -\tfrac{1}{2}V^2 \partial^2 3/\partial x^2 \qquad (4)$$

Changing the frequency tuning voltage can change the spring constant of the suspension unit in two different ways. Firstly, as the distance between the first spring and second spring change in resonance oscillation movement, the capacitance between the first and second spring also changes. The suspenders effectively act like a gap-varied parallel-plate capacitor. It can be seen from Equation 4 that the electrical spring constant gets larger as the frequency tuning voltage increases.

On the other hand, when the first springs and second springs bend towards each other, the mechanical spring constant of the suspension unit increases due to geometrical changes in the first and second springs. Depending on the structural details of the suspension unit, the application of a frequency tuning voltage can therefore either decrease the spring constant of the suspension unit (if the electrostatic spring constant predominates) or increase the spring constant of the suspension unit (if the tension-dependent increase in the spring constant predominates).

In this disclosure the expression "substantially parallel" refers primarily to the orientation of the suspenders when the mass is in a rest position where no actuation forces or tuning voltages are applied. This is the situation illustrated in FIG. 1a. However, one benefit of the arrangement described in this disclosure is that forces which produce frequency tuning are generated throughout the oscillation cycle, even when the first and second springs are not perfectly parallel to each other. This includes the situation illustrated in FIG. 1b, where the first and second springs are bent. For the purposes of this disclosure, the springs in FIG. 1b can therefore also be considered substantially parallel.

Furthermore, it is obvious to a person skilled in the art that the first and second springs do not necessarily have to be exactly parallel in their rest state to generate forces which are for frequency tuning. The first and second springs may be lie only approximately parallel to each other in their rest state, or they may be parallel only for a part of their length. Any first and second springs that are sufficiently adjacent to each other during the oscillation cycle can in principle be used for frequency tuning.

First and second springs must be electrically isolated from each other if a frequency-tuning voltage is to be applied between them. FIG. 1c illustrates one example of an isolation arrangement. If the mass element 13 and the anchor point are made from a material which conducts electricity, such as silicon, then the first springs and the second springs must be electrically separated at both ends.

In FIG. 1c, the anchor point 14 has been split into three separate areas 141-143. Area 141, where first spring 111 is attached, is electrically separated from the central area 142 by a first isolating region 161. Area 143, where first spring 112 is attached, is separated from the central area 142 by a second isolating region 162. If the illustrated device is manufactured in an etching process where a device wafer is etched in the z-direction, the first and second isolating regions 161 and 162 may for example be prepared by etching a trench through the device wafer in the illustrated region and filling that trench (or the sidewalls of that trench) with an electrically isolating material such as silicon dioxide.

In FIG. 1c, each first spring 111 and 112 is electrically separated from the mass element by a corresponding isolating region 151 and 152 in the mass element. If the illustrated device is manufactured in an etching process where a device wafer is etched in the z-direction, the isolating regions 151 and 152 may be prepared in the mass element in similar way as the isolating regions 161 and 162. Isolating regions could alternatively be manufactured near the end of the springs 111 and 112 which is closest to the mass element 13, but the isolating regions should in that case also withstand bending and/or twisting motion.

The first electric potential may be connected to the first springs 111 and 112 via areas 141 and 142, while the second electric potential may be connected to the second springs 121 and 122 via area 143. The isolating regions 151 and 152 could equally well be placed around the attachment points of second springs 121 and 122, since this also prevents short-circuiting of the frequency-tuning voltage through the mass element 13. It may be advantageous in some applications to set the mass element at a certain electric potential. By suitable placement of the isolating regions, the mass element can be set to either the first electric potential or the second electric potential. Isolating regions could also be placed around the attachment points of both the first springs 111 and 112 and the second springs 121 and 122 if it is preferable not to set the mass element to the first or the second electric potential.

FIG. 2 illustrates the corresponding method for tuning a resonance frequency. The microelectromechanical system may comprise sensing means for sensing the resonance frequency of the mass element. The microelectromechanical system may also comprise a control unit which is configured at least to read a measurement signal from the sensing means and to set the frequency tuning voltage. The control unit may comprise a memory unit.

As illustrated in FIG. 2, the control unit may read a resonance frequency value from the sensing means and compare it to a target value which has been stored in the memory unit. If the resonance frequency does not differ from the target value, the control unit may be configured to return to the first step and read a new resonance frequency value after a predetermined time interval. If the measured resonance frequency does differ from the target value, the control unit may be configured to adjust the frequency tuning voltage $V_{12}$. New adjustment can be made until the measured resonance equals the target value.

The control unit may be configured to adjust the frequency tuning voltage in one direction if the measured resonance frequency value exceeds the target value, and in another direction if the target value exceeds the measured resonance frequency value.

FIGS. 1a-1c illustrate embodiments where the suspension unit comprises two first springs and two second springs. This geometry can be generalized in the following manner: each suspension unit may comprise a spring row with 2N first springs and 2N second springs, where N is an integer. Either two first springs or two second springs may lie at the ends of the row, and all other first springs and second springs may lie between an adjacent first spring and an adjacent second spring.

Figure 3:
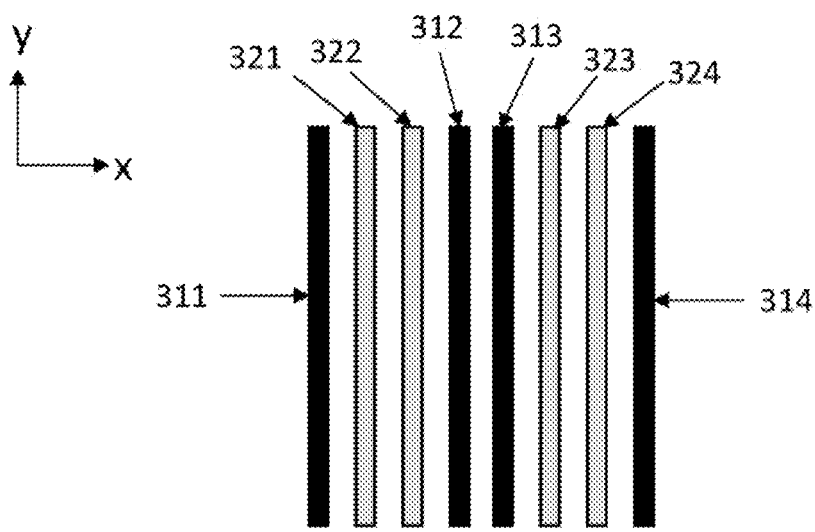
FIG. 3 illustrates four first springs and four second springs.

FIGS. 1a-1c illustrate the case where N=1. The case N=2 is illustrated in FIG. 3, where only the spring row is illustrated (the mass element and the anchor point are not). FIG. 3 illustrates four first springs 311-314 and four second springs 321-324. Two first springs 311 and 314 lie at the end of the row, and all other first springs 312-313 and second springs 321-324 are placed pairwise between first springs 311 and 314.

This configuration ensures that each first spring and second spring is affected by an electric force from only one side when the frequency tuning voltage is turned on. As seen in FIG. 3, first springs 312-313 and second springs 321-324 all lie between an adjacent first spring and an adjacent second spring. For example, first spring 312 lies between second spring 322 and first spring 313. Since all first springs are set to the same electric potential, first spring 312 will only be affected by the force produced by second spring 322.

The same configuration can be created if N>2 by placing two first springs or two second springs at the ends of the row and then placing the rest of the springs pairwise between those end springs. The first and second springs may be isolated from each other in the same manner as in FIG. 1c also when N>1.

FIGS. 4a-4b illustrate an alternative embodiment where a suspension unit comprises two first springs 411 and 412 and one second spring 42, and the second spring 42 lies between the two first springs 411 and 412. In this case the application of a frequency tuning voltage V12 may bend both first springs 411 and 412 toward the second spring 42, as illustrated in FIG. 4b. Alternatively, a suspension unit may comprise only one first spring and only one second spring. This alternative has not been separately illustrated for in-plane oscillation. When a frequency tuning voltage is applied, the first and second springs will then bend in the same manner as, for example, springs 111 and 121 in FIG. 1b. In each case presented above, the springs may be isolated from each other in the same manner as in FIG. 1c.

All embodiments illustrated in FIGS. 1a 1c, 3 and 4a-4b can be implemented when the drive transducer is configured to set the mass element in translational oscillation in the device plane. An example of this in-plane oscillation mode is illustrated in FIG. 5, where drive transducer 59 has moved mass element 53 aside from its rest-position symmetry axis A and the first springs 511-512 and second springs 521-522 have been bent to the shape of an elongated letter S. Alternatively, the first and second springs may be bent in the same direction along their entire length, so that the curvature does not change sign.

In other words, the partly mobile mass element may have a rest position in a device plane, and the at least one drive transducer may be configured to set the partly mobile mass element in translational resonance oscillation within the device plane.

The first and second spring can be configured to allow in-plane oscillation by dimensioning them suitably. For example, in all preceding figures the first springs and second springs are narrow in the x-direction, which facilitates bending. The first and second springs may in this case be relatively thick in the z-direction to provide support for the weight of the mass element.

Figure 6:
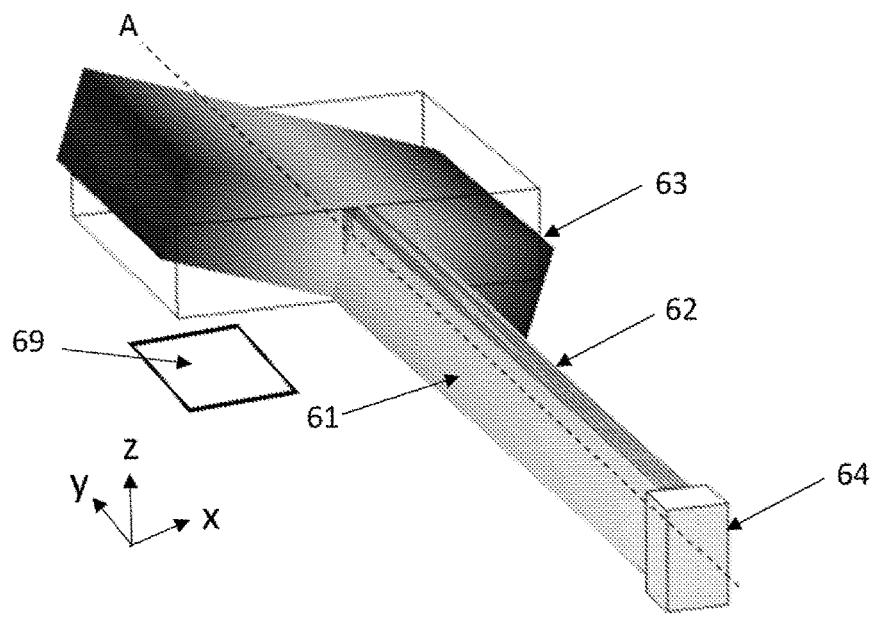
FIG. 6 illustrates rotational out-of-plane oscillation.

FIG. 6 illustrates a mass element 63 which oscillates rotationally out of the device plane by rotating about the symmetry axis A due to the influence of drive transducer 69. The mass element is suspended from anchor point 64 by one first spring 61 and one second spring 62. Due to their narrow width in the x-direction, first spring 61 and second spring 62 can be twisted around their longitudinal axis by forces that are transmitted to the springs either from the mass element 63 or from the drive transducer 69. The oscillation amplitudes illustrated in both figures are exaggeratedly large in comparison to other dimensions in the microelectromechanical system.

In other words, the partly mobile mass element may have a rest position in a device plane, and the at least one drive transducer may be configured to set the partly mobile mass element in rotational resonance oscillation out of the device plane.

A suspension unit with one first spring and one second spring can be made flexible for the rotational oscillation illustrated in FIG. 6 by placing the first and second spring sufficiently close to each other in the x-direction. Suspension units with more than two parallel springs in the device plane can also show some flexibility for out-of-plane rotation, even though the increasing distance between the central axis A and the springs at the end of the row will gradually make the suspension unit stiffer against twisting.

The operating principle described in the beginning applies to all of these cases. The frequency tuning voltage can induce both an electrostatic spring constant and a tension-dependent change in the spring constant. Either one of these may be predominant, depending on the dimensions of the spring and the mass element and on the magnitude of the frequency tuning voltage. Consequently, frequency tuning may either decrease or increase the resonance frequency.

Figure 7:
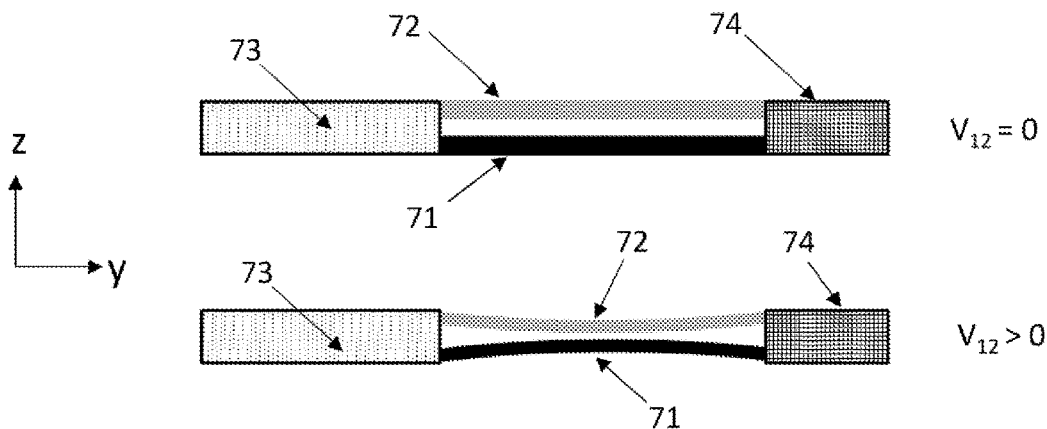
FIG. 7 illustrates a mass element configured to undergo oscillation out of the device plane and first and second springs.

FIG. 7 illustrates a mass element which is configured to undergo oscillation out of the device plane. In this mode, the mass element 73 moves out of the xy-plane in the oscillation cycle. The suspension unit comprises one first spring 71 and one second spring 72. The upper part of the figure illustrates the location of the springs when no frequency tuning voltage is applied, and the lower part of the figure illustrates the situation when a frequency tuning voltage applied. The effect and the operating principle is the same which was described above.

The application of a frequency-tuning voltage to the first and second springs does not move the mass element to a significant extent. Due to the action of the drive transducer 69 in FIG. 5, the mass element 13 undergoes in-plane oscillation approximately along the x-axis, in FIG. 6 it rotates about the y-axis and in FIG. 7 it will move approximately along the z-axis. In each case, the frequency-tuning-voltage does not produce a force in the same direction as the drive transducer. It merely changes the spring constant of the oscillating system.

A small movement along the y-direction may result from the illustrated spring bending in FIGS. 5 and 7, but this will not typically have any effect on the oscillation driven by the drive transducer. In other words, the frequency-tuning voltage does not actuate any motion in the mass element 13, or in the mass elements discussed in other embodiments presented in this disclosure.

Suspension units configured to allow out-of-plane oscillation can also be configured with multiple first springs and/or multiple second springs, and these springs may be organized vertically in the manner illustrated (horizontally) in FIGS. 1*a*-1*b*, 3 or 4*a*-4*b*, for example.

Figure 8:
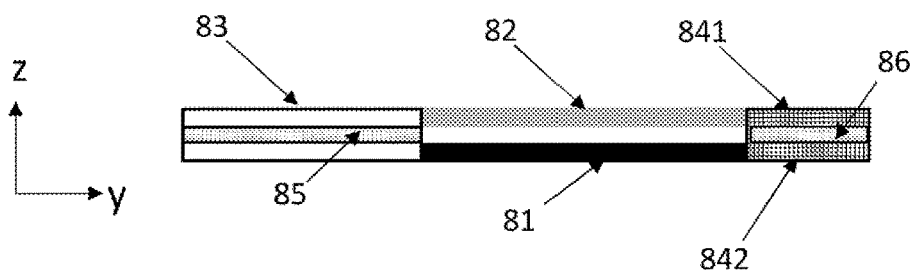
FIG. 8 illustrates isolation of the first and second springs.

The springs may be isolated from each other in the manner illustrated in FIG. 8. In FIG. 8, first spring 81 is electrically separated from the second spring 82 by an isolating region 85 in the mass element 83 and isolating region 86 in the anchor point 841/842. These isolating regions divide the mass element and the anchor point, respectively, into two electrically separated regions. Alternatively, the arrangement illustrated in FIG. 1*c* could be used to electrically separate the first spring 81 from the second spring 82. The isolating regions 86 and 85 may for example be prepared by using a double-Silicon-On-Insulator wafer as the device wafer.

The first electric potential may be connected to the first spring 81 via region 841 of the anchor point, while the second electric potential may be connected to the second spring 82 via region 842 of the anchor point. Regions 841 and 842 in the anchor point may be separated from each other by an isolating region 86.

Figure 9:
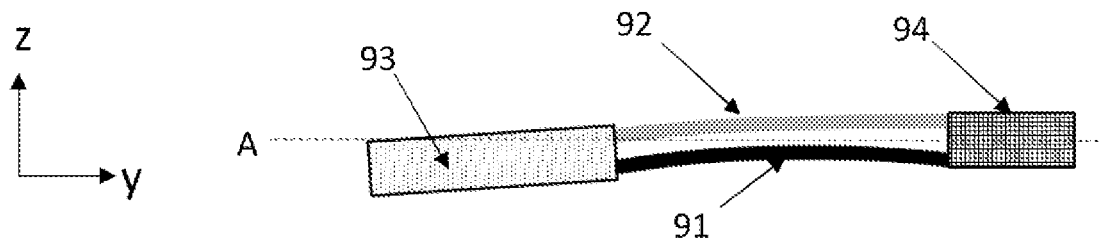
FIG. 9 illustrates out-of-plane oscillation.

The embodiment illustrated in FIGS. 7 and 8 can be implemented when the drive transducer is configured to set the mass element in translational oscillation out of the device plane. An example of this out-of-plane oscillation mode is illustrated in FIG. 9, where reference numbers 91-94 correspond to reference numbers 71-74 and 81-841/842, respectively, in FIGS. 7 and 8. The mass element 93 has moved downward from its horizontal rest-position symmetry axis A.

The first spring 91 and second spring 92 can be configured to allow in-plane oscillation by dimensioning them suitably. In FIGS. 7 and 8 the first springs and second springs are thin in the z-direction, which facilitates out-of-plane bending. The first and second springs may in this case be relatively wide in the z-direction to provide support for the weight of the mass element.

In other words, the partly mobile mass element may have a rest position in a device plane, and the at least one drive transducer may be configured to set the partly mobile mass element in translational resonance oscillation out of the device plane.

Figure 10:
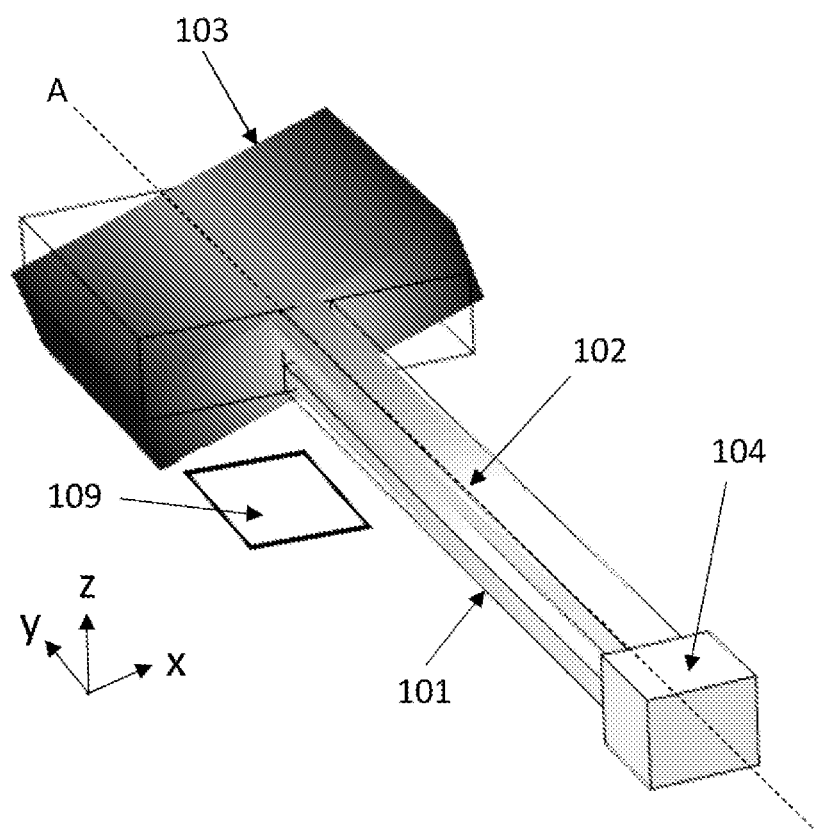
FIG. 10 illustrates rotational out-of-plane oscillation.

FIG. 10 illustrates a mass element 103 which oscillates rotationally out of the device plane by rotating about the symmetry axis A due to the influence of drive transducer 109. Reference numbers 101-104 correspond to reference numbers 91-94 in FIG. 9. The mass element is suspended from anchor point 104 by one first spring 101 and one second spring 102. Due to their thinness in the z-direction, first spring 101 and second spring 102 can be twisted around their longitudinal axis by forces that are transmitted to the springs either from the mass element 103 or from the drive transducer 109. The oscillation amplitudes illustrated in both FIGS. 9 and 10 are exaggeratedly large in comparison to other dimensions in the microelectromechanical system.

In other words, the partly mobile mass element may have a rest position in a device plane, and the at least one drive transducer may be configured to set the partly mobile mass element in rotational resonance oscillation out of the device plane.

A suspension unit with one first spring and one second spring can be made flexible for the rotational oscillation illustrated in FIG. 6 by placing the first and second spring sufficiently close to each other in the x-direction. Suspension units with more than two parallel springs in the device plane can also show some flexibility for out-of-plane rotation, even though the increasing distance between the central axis A and the springs at the end of the row will gradually make the suspension unit stiffer against twisting.

The micromechanical system may comprise one or more suspension units which can be used for tuning a resonance frequency in in-plane oscillation, and one or more suspension units which can be used for tuning a resonance frequency in out-of-plane oscillation. An in-plane and an out-of-plane suspension unit may be connected to the same mass element.

The invention claimed is:

1. A microelectromechanical system comprising a fixed support, at least one partly mobile mass element which is suspended from the fixed support by one or more suspension units, and at least one drive transducer which is configured to set the partly mobile mass element in resonance oscillation at a resonance frequency, wherein each suspension unit comprises one or more first springs which extend from the fixed support to the partly mobile mass element, wherein each suspension unit also comprises one or more second springs, and each second spring extends from the fixed support to the partly mobile mass element substantially parallel and adjacent to one first spring, and wherein the one or more first springs are electrically isolated from the one or more second springs by one or more isolating regions located in the mass element or in the one or more first springs or in the one or more second springs, and the microelectromechanical system further comprises a voltage source configured to apply a frequency tuning voltage between the one or more first springs and the one or more second springs.

2. A microelectromechanical system according to claim 1, wherein each suspension unit comprises one first spring and one second spring.

3. A microelectromechanical system according to claim 1, wherein each suspension unit comprises two first springs and one second spring, and the second spring lies between the two first springs.

4. A microelectromechanical system according to claim 1, wherein each suspension unit comprises a spring row with 2N first springs and 2N second springs, where N is an integer, wherein either two first springs or two second springs lie at the ends of the row, and all other first spring and second springs lie between an adjacent first spring and an adjacent second spring.

5. A microelectromechanical system according to claim 1, wherein the partly mobile mass element has a rest position in a device plane, and the at least one drive transducer is configured to set the partly mobile mass element in translational resonance oscillation within the device plane.

6. A microelectromechanical system according to claim 1, wherein the partly mobile mass element has a rest position in a device plane, and the at least one drive transducer is configured to set the partly mobile mass element in translational resonance oscillation out of the device plane.

7. A microelectromechanical system according to claim 1, wherein the partly mobile mass element has a rest position in a device plane, and the at least one drive transducer is configured to set the partly mobile mass element in rotational resonance oscillation out of the device plane.

8. A method for tuning a resonance frequency of a microelectromechanical system which comprises a fixed support, at least one partly mobile mass element which is suspended from the fixed support by one or more suspension units, and at least one drive transducer which is configured to set the partly mobile mass element in resonance oscillation at the resonance frequency, wherein each suspension unit comprises one or more first springs which extend from the fixed support to the partly mobile mass element, wherein each suspension unit also comprises one or more second springs, and each second spring extends from the fixed support to the partly mobile mass element substantially parallel and adjacent to one first spring, and the one or more first springs are electrically isolated from the one or more second springs by one or more isolating regions located in the mass element or in the one or more first springs or in the one or more second springs, and the microelectromechanical system further comprises a voltage source configured to apply a frequency tuning voltage between the one or more first springs and the one or more second springs, the method comprises the steps of:

repeatedly reading the resonance frequency from the microelectromechanical system and comparing it to a predetermined target value and, if the resonance frequency differs from the predetermined target value, adjusting the frequency tuning voltage to a value where the resonance frequency becomes equal to the predetermined target value.

* * * * *